US008709941B2

(12) United States Patent
Besser

(10) Patent No.: US 8,709,941 B2
(45) Date of Patent: Apr. 29, 2014

(54) METHOD FOR FORMING CONTACT IN AN INTEGRATED CIRCUIT

(71) Applicant: Advanced Micro Devices, Inc., Sunnyvale, CA (US)

(72) Inventor: Paul R. Besser, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 13/633,302

(22) Filed: Oct. 2, 2012

(65) Prior Publication Data

US 2013/0072014 A1 Mar. 21, 2013

Related U.S. Application Data

(62) Division of application No. 11/963,254, filed on Dec. 21, 2007, now Pat. No. 8,283,786.

(51) Int. Cl.
*H01L 21/4763* (2006.01)

(52) U.S. Cl.
USPC ........................................... 438/629; 977/742

(58) Field of Classification Search
USPC ............................ 438/629, 672, 675; 977/742
See application file for complete search history.

(56) References Cited

U.S. PATENT DOCUMENTS

| 7,518,247 B2 * | 4/2009 | Sakamoto et al. ............ 257/773 |
| 7,736,615 B2 * | 6/2010 | Kawabata et al. ......... 423/447.2 |
| 8,198,193 B2 * | 6/2012 | Sakuma et al. ............... 438/637 |
| 2004/0152240 A1 * | 8/2004 | Dangelo ........................ 438/122 |
| 2004/0182600 A1 * | 9/2004 | Kawabata et al. ............ 174/250 |
| 2004/0253805 A1 * | 12/2004 | Dubin et al. ................... 438/618 |
| 2005/0167755 A1 * | 8/2005 | Dubin et al. ................... 257/368 |
| 2007/0096326 A1 | 5/2007 | Chang |
| 2007/0228926 A1 * | 10/2007 | Teo et al. ....................... 313/495 |
| 2008/0142776 A1 * | 6/2008 | Seidl ................................ 257/4 |
| 2008/0237858 A1 * | 10/2008 | Nihei ............................ 257/746 |
| 2008/0245553 A1 * | 10/2008 | Sakai et al. ................... 174/257 |
| 2009/0159985 A1 * | 6/2009 | Besser ........................... 257/384 |
| 2009/0200536 A1 | 8/2009 | Van Schaijk |
| 2012/0052680 A1 * | 3/2012 | Sakuma et al. ............... 438/675 |

FOREIGN PATENT DOCUMENTS

| EP | 1 361 608 | 11/2003 |
| JP | 2003-131296 | 5/2003 |
| JP | 2004-304667 | 10/2004 |
| JP | 2005-165004 | 6/2005 |
| JP | 2005-203960 | 7/2005 |
| JP | 2006-120730 | 5/2006 |
| JP | 2006-185636 | 7/2006 |
| JP | 2006-339552 | 12/2006 |
| KR | 10-2002-0079854 | 10/2002 |

* cited by examiner

*Primary Examiner* — S. V. Clark

(74) *Attorney, Agent, or Firm* — Farjami & Farjami LLP

(57) ABSTRACT

A method for forming an integrated circuit system includes providing an integrated circuit device; and forming an integrated contact over the integrated circuit device including: providing a via over the integrated circuit device; forming a selective metal in the via; forming at least one nanotube over the selective metal; and forming a cap over the nanotubes.

19 Claims, 3 Drawing Sheets

US 8,709,941 B2

METHOD FOR FORMING CONTACT IN AN INTEGRATED CIRCUIT

This is a divisional of application Ser. No. 11/963,254 filed Dec. 21, 2007.

TECHNICAL FIELD

The present invention relates generally to integrated circuit systems, and more particularly to a system for an integrated circuits with integrated contacts.

BACKGROUND ART

Many modern products that we take for granted include integrated circuits. These tiny devices are used in common products and systems such as wireless communication, industrial robotics, spacecraft, and a vast array of consumer products such as cell phones, portable computers, music players, and automobiles. Across virtually all applications, there continues to be demand for increasing functions and reducing the size of the devices.

Manufacturing such devices typically utilizes various techniques, such as layering, doping, masking, and etching, to build electrical components on a substrate. The components are then interconnected to define specific electric circuits, such as a processors or memory including storage. Integrated circuits development is driven by reduced size, lower power consumption, and increased operating speed.

The integrated circuit contains semiconductor devices, such as transistors, capacitors and resistors, formed on the silicon substrate. The electrical connections used to connect the integrated circuits to form a working device are known as "interconnects". Interconnects consist of conductive lines formed in the plane of the substrate, and contacts formed in the direction perpendicular to the plane of the substrate. Several interconnect levels may be used in the integrated circuit sometimes eight or more levels.

High quality contacts are essential to high device yield and reliability, but fabrication of these high quality contacts poses several technical challenges. For example, the contacts are designed to have a high ratio of the height to the diameter, known as the aspect ratio. High aspect ratio is a consequence of several constraints in the design of the IC.

For example, it is desirable to achieve a high packing density of the contacts to enable high circuit density. This constrains the diameter of the contacts to be as small as possible. In addition, the dielectric separating the semiconductor devices from the first metal level must be thick enough to protect transistors. The contacts often span the thickness of dielectric over a transistor and transistor gate over the substrate. These constraints lead to contacts with aspect ratios large enough to present manufacturing challenges.

As integrated circuit technology become smaller, the large aspect ratio combined with very small geometries creates many manufacturing and performance issues. Current attempts to manufacture very small contacts have been plagued with very high resistance. These contact resistances can dominate integrated circuit performance particularly with small process geometries such as thirty-two nanometers.

Several attempts have been made to improve some of the several components of contact resistance. For example, changing silicide interfaces or metallization materials have fallen short of the demands for smaller technology nodes. Containing metallization materials and resistance in materials at dimensions that fall below material characteristics such as mean free path of electrons are prohibitive.

Thus, a need still remains for an integrated circuit system to improve contact performance and reliability particularly with small geometry technology nodes. In view of the ever-increasing commercial competitive pressures, coupled with the technical imperatives of improved die-to-die variation and improved production efficiency, it is critical that answers be found for these problems. Competitive pressures also demand lower costs alongside improved efficiencies and performance.

Solutions to these problems have been long sought but prior developments have not taught or suggested any solutions and, thus, solutions to these problems have long eluded those skilled in the art.

DISCLOSURE OF THE INVENTION

The present invention provides an integrated circuit device; and forming an integrated contact over the integrated circuit device including: providing a via over the integrated circuit device; forming a selective metal in the via; forming at least one nanotube over the selective metal; and forming a cap over the nanotubes.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
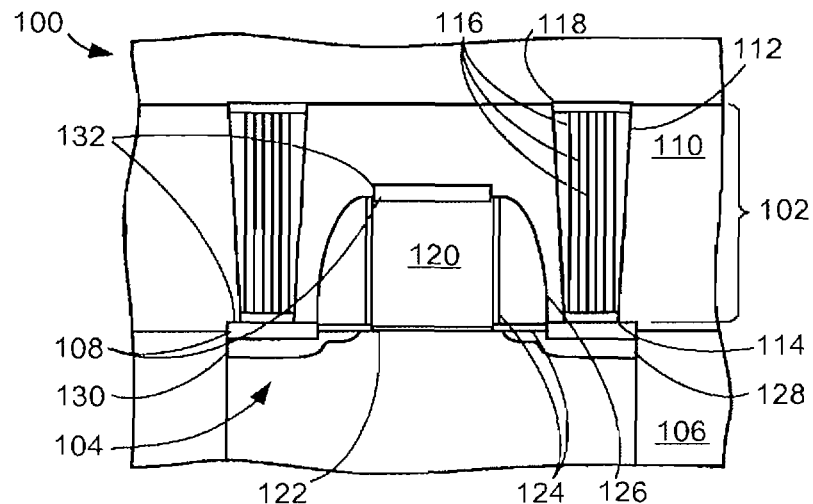
FIG. 1 is a cross-sectional view of an integrated circuit system taken along line 1--1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGS.

Where multiple embodiments are disclosed and described, having some features in common, for clarity and ease of illustration, description, and comprehension thereof, similar and like features one to another will ordinarily be described with like reference numerals. The embodiments may be numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the invention, regardless of its orientation. The term "vertical" refers to a direction perpendicular to the horizontal as just defined, Terms, such as "on", "above", "below", "bottom", "top", "side" (as in "sidewall"), "higher", "lower", "upper", "over", and "under", are defined with respect to the horizontal plane.

The term "on" as used herein means and refers to direct contact among elements. The term "processing" as used herein includes deposition of material, patterning, exposure, development, etching, cleaning, and/or removal of the material or trimming as required in forming a described structure. The term "system" as used herein means and refers to the method and to the apparatus of the present invention in accordance with the context in which the term is used.

Figure 2:
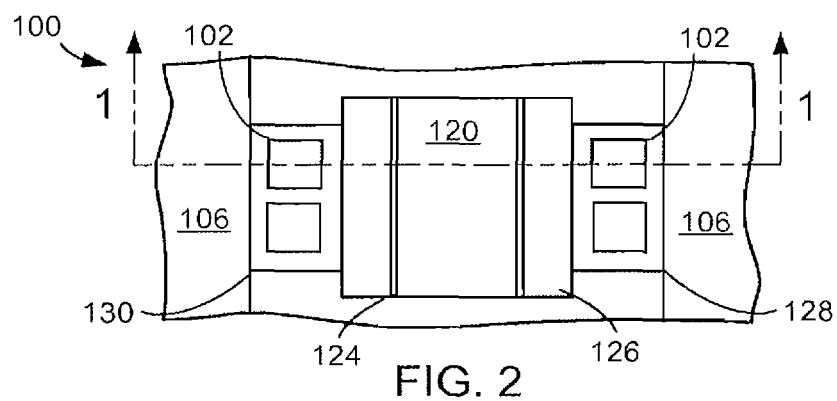
FIG. 2 is a top plan view of the integrated circuit system.

Referring now to FIG. 1, therein is shown a cross-sectional view of an integrated circuit system 100 taken along line 1--1 of FIG. 2 in a first embodiment of the present invention. The integrated circuit system 100 can preferably include an integrated contact 102 formed over an integrated circuit device 104 such as a CMOS transistor. Shallow trench isolation regions 106 can be formed adjacent to the integrated circuit device 104.

The integrated circuit device 104 can preferably include a silicide layer 108 such as cobalt silicide ($CoSi_2$), nickel silicide (NiSi), other silicides, or combination thereof. A contact dielectric 110 having a via 112 can be formed over the silicide layer 108. A selective metal 114 such as cobalt (Co), nickel (Ni), iron (Fe), or other metal can be formed in the via 112 over the silicide layer 108.

Nanotubes 116 such as carbon nanotubes can be formed in the via 112 over the selective metal 114. A process such as soft chemical-mechanical polishing or planarization (Soft CMP) can be applied to the nanotubes 116 to provide spacing for a cap 118. The cap 118 such as tantalum nitride (TaN), ruthenium (Ru), or other barrier metal can be formed over the nanotubes 116 partially in the via 112.

The nanotubes growth can be over the selective metal 114 wherein the selective metal 114 can be formed from any metal or combination thereof providing selective and directional growth of the nanotubes 116. The nanotubes 116 can be preferably be formed vertically adjacent the longer sides of the via 112 such as in an upward direction from a bottom surface having the selective metal 114.

A similar process such as chemical-mechanical polishing or planarization (CMP) can be applied to the cap 118 for electrical isolation of the cap 118 during further processing. Back-end-of-line (BEOL) processes such as metal deposition or contact formation can be applied over the integrated circuit system 100 having the integrated contact 102 and the integrated circuit device 104.

The integrated circuit device 104 can include a gate 120 such as a polysilicon gate. The gate 120 can be formed over a gate dielectric 122. An insulator 124 can be formed adjacent the gate 120. Spacers 126 can be formed adjacent the insulator 124 and the gate 120 for formation of a source region 128 such as active silicon and a drain region 130 such as active silicon. The silicide layer 108 can be applied over the source region 128, the drain region 130, and the gate 120 to form contact surfaces 132.

For illustrative purposes, the integrated contacts 102 are shown over the integrated circuit device 104 although it is understood that the integrated contact 102 may be formed over other devices or materials.

It has been discovered that the integrated circuit system 100 with the integrated contact 102 provides improved integration of the nanotubes 116 with the integrated circuit device 104 providing lower contact resistance or higher operating speeds.

Referring now to FIG. 2, therein is shown a top plan view of the integrated circuit system 100. The integrated circuit system 100 preferably includes the integrated contact 102 over the source region 128 and the drain region 130. The gate 120 can be formed between the source region 128 and the drain region 130.

The insulator 124 and the spacers 126 can be formed adjacent the gate 120 and near an inner edge of the source region 128 and an inner edge of the drain region 130. One of the shallow trench isolation regions 106 can be formed near an outer edge of the source region 128 and another of the shallow trench isolation regions 106 can be formed near an outer edge of the drain region 130.

Figure 3:
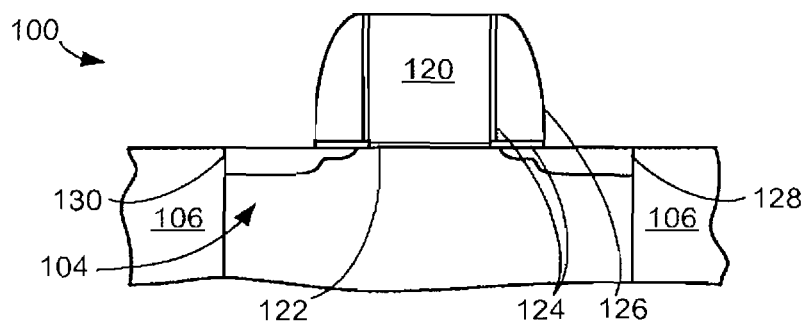
FIG. 3 is a cross-sectional view of the structure of FIG. 1 in a transistor formation phase.

Referring now to FIG. 3, therein is shown a cross-sectional view of the structure of FIG. 1 in a transistor formation phase. The integrated circuit system 100 can preferably include the integrated circuit device 104. The shallow trench isolation regions 106 can be formed near outer edges of the integrated circuit device 104.

The integrated circuit device 104 can include the gate 120 formed over the gate dielectric 122. The spacers 126 can be formed adjacent the insulator 124 and the gate 120. The source region 128 can be formed near the spacers 126 on one side of the gate 120. The drain region 130 can be formed near another of the spacers 126 on a side of the gate 120 substantially opposite the source region 128.

Figure 4:
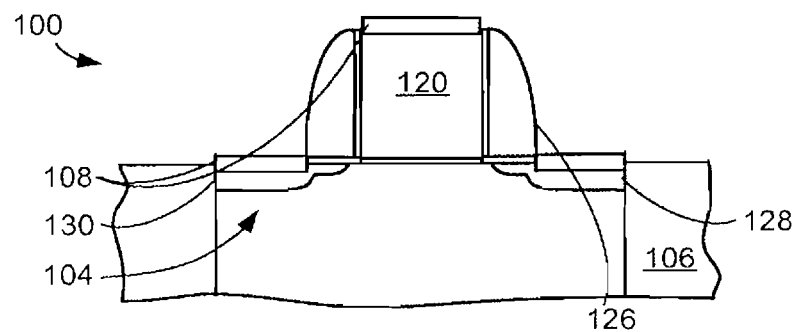
FIG. 4 is a cross-sectional view of the structure of FIG. 3 in a salicidation phase.

Referring now to FIG. 4, therein is shown a cross-sectional view of the structure of FIG. 3 in a salicidation phase. The integrated circuit system 100 can preferably include the integrated circuit device 104 with the shallow trench isolation regions 106 formed near outer edges of the integrated circuit device 104.

A salicidation process can form the silicide layer 108 over the source region 128, the drain region 130, or the gate 120. The salicidation process substantially prevents silicide formation on dielectric surfaces such as oxides, nitrides, oxide spacers, nitride spacers, or the spacers 126, Referring now to FIG. 5, therein is shown a cross-sectional view of the structure of FIG. 4 in a dielectric formation phase. The integrated circuit system 100 can preferably include the integrated circuit device 104 with the shallow trench isolation regions 106 formed near outer edges of the integrated circuit device 104.

The contact dielectric 110 can be deposited over the integrated circuit device 104. Patterning and etching of the contact dielectric 110 can result in the via 112 having a high aspect ratio and exposed regions of the silicide layer 108. Another deposition process such as electroless deposition can provide the selective metal 114 in the via 112 wherein the process can be selective resulting in the selective metal 114 deposited only over the silicide layer 108.

Figure 5:
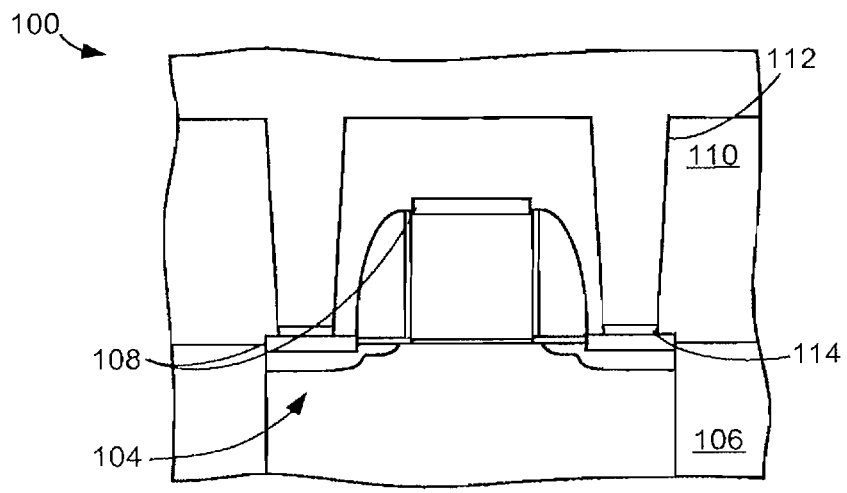
FIG. 5 is a cross-sectional view of the structure of FIG. 4 in a dielectric formation phase.
Figure 6:
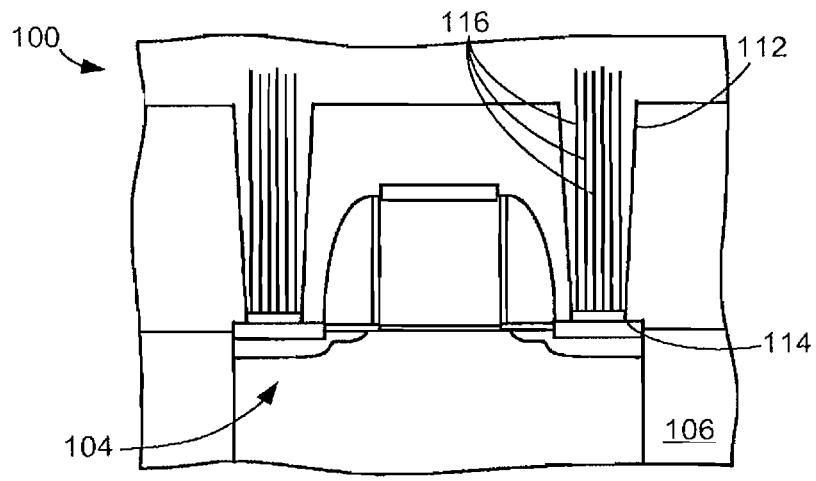
FIG. 6 is a cross-sectional view of the structure of FIG. 5 in a conductor formation phase.

Referring now to FIG. 6, therein is shown a cross-sectional view of the structure of FIG. 5 in a conductor formation phase. The integrated circuit system 100 can preferably include the integrated circuit device 104 with the shallow trench isolation regions 106 formed near outer edges of the integrated circuit device 104.

The selective metal 114 can be a catalyst for growth of the nanotubes 116. The nanotubes 116 can be formed by a process such as exposing the selective metal 114 to a carbon containing gas at elevated temperatures. For example, a gas such as ethanol or super-critical carbon dioxide ($CO_2$) can be applied to the selective metal 114 near a bottom of the via 112 wherein an elevated temperature promotes growth of the nanotubes 116.

Figure 7:
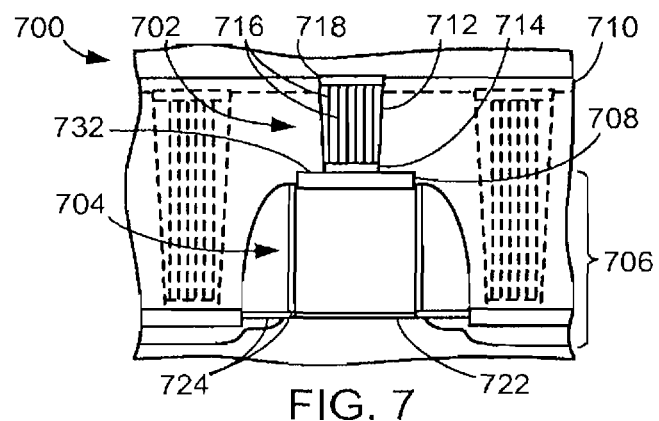
FIG. 7 is a cross-sectional view of an integrated circuit system in a second embodiment of the present invention.

Referring now to FIG. 7, therein is shown a cross-sectional view of an integrated circuit system 700 in a second embodiment of the present invention. The integrated circuit system 700 can preferably include an integrated contact 702 formed over a gate 704 of an integrated circuit device 706.

The gate 704 can preferably include a silicide layer 708 such as cobalt silicide, nickel silicide, other silicides, or combination thereof. A contact dielectric 710 having a via 712 can be formed over the silicide layer 708, A selective metal 714 such as cobalt, nickel, iron, or other metal can be formed in the via 712 over the silicide layer 708.

Nanotubes 716 such as carbon nanotubes can be formed in the via 712 over the selective metal 714. A process such as soft chemical-mechanical polishing or planarization can be applied to the nanotubes 716 to provide spacing for a cap 718. The cap 718 such as tantalum nitride, ruthenium), or other barrier metal can be formed over the nanotubes 716 partially in the via 712.

A similar process such as chemical-mechanical polishing or planarization can be applied to the cap 718 for electrical isolation of the cap 718 during further processing. Back-end-of-line processes such as metal deposition or contact formation can be applied over the integrated circuit system 700 having the integrated contact 702 and the gate 704.

The gate 704 can be formed over a gate dielectric 722. An insulator 724 can be formed adjacent the gate 704. Spacers 726 can be formed adjacent the insulator 724 and the gate 704. The silicide layer 708 can be applied over the gate 704 to form a contact surface 732 for the gate 704 of the integrated circuit device 706.

Figure 8:
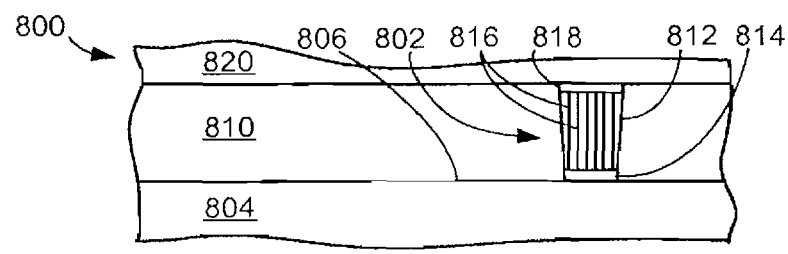
FIG. 8 is a cross-sectional view of an integrated circuit system in a third embodiment of the present invention.

Referring now to FIG. 8, therein is shown a cross-sectional view of an integrated circuit system 800 in a third embodiment of the present invention. The integrated circuit system 800 can preferably include an integrated contact 802 formed over a first conductive layer 804 having a contact surface 806.

A contact dielectric 810 having a via 812 can be formed over the contact surface 806 of the first conductive layer 804. A selective metal 814 such as cobalt, nickel, iron, or other metal can be formed in the via 812 over the contact surface 806.

Nanotubes 816 such as carbon nanotubes can be formed in the via 812 over the selective metal 814. A process such as soft chemical-mechanical polishing or planarization can be applied to the nanotubes 816 to provide spacing for a cap 818, The cap 818 such as tantalum nitride, ruthenium, or other barrier metal can be formed over the nanotubes 816 for protecting the nanotubes 816 or contacting a next layer.

A similar process such as chemical-mechanical polishing or planarization can be applied to the cap 818 for electrical isolation of the cap 818 during further processing such as a metallization process forming a second conductive layer 820 over the integrated contact 802.

Figure 9A:
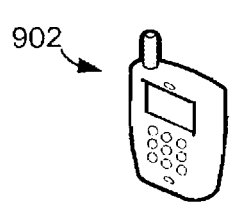
FIGS. 9A, 9B, and 9C are schematic views of electronics systems as examples in which various aspects of the present invention can be implemented.
Figure 9B:
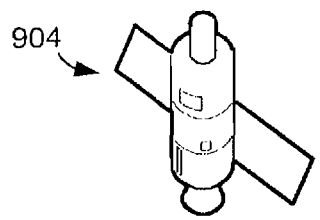
Figure 9C:
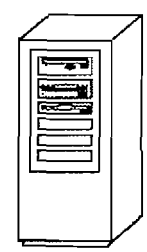

Referring now to FIGS. 9A, 9B, and 9C therein are shown schematic views of electronics systems as examples in which various aspects of the present invention can be implemented. The electronics systems can be any system performing any function including data: creation, transportation, transmittal, modification, storage, or combination thereof. Any of the electronics systems can include one or more subsystems, such as printed circuit boards, substrates or other electronic assemblies.

As examples, the electronics systems such as a cellular phone 902, a satellite 904, and a computer system 906 can include an integrated circuit having the present invention. For example, information created, transported, or stored on the cellular phone 902 can be transmitted to the satellite 904. Similarly, the satellite 904 can transmit or modify the information to the computer system 906 wherein the information can be stored, modified, or transmitted by the computer system 906.

Figure 10:
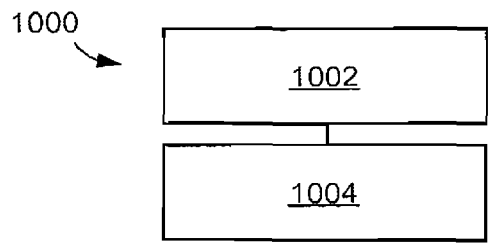
FIG. 10 is a flow chart of an integrated circuit system for manufacturing the integrated circuit system in an embodiment of the present invention.

Referring now to FIG. 10, therein is shown a flow chart of an integrated circuit system 1000 for manufacturing the integrated circuit system 100 in an embodiment of the present invention. The system 1000 includes providing an integrated circuit device a block 1002; forming an integrated contact over the integrated circuit device including: providing a via over the integrated circuit device; forming a selective metal in the via; forming at least one nanotube over the selective metal; and forming a cap over the nanotubes in a block 1004.

In greater detail, a system to provide the method and apparatus of the integrated circuit system 100, in an embodiment of the present invention, is performed as follows:
1. Providing an integrated circuit device having a contact surface.
2. Forming an integrated contact over the contact surface including: forming a via over the contact surface; forming a selective metal in the via over the contact surface; forming at least one nanotube over the selective metal over the contact surface; and forming a cap over the nanotubes partially in the via.

Thus, it has been discovered that the integrated circuit system method and apparatus of the present invention furnish important and heretofore unknown and unavailable solutions, capabilities, and functional aspects. The resulting processes and configuration are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:
1. A method for forming an integrated circuit system comprising:
   providing an integrated circuit device; and
   forming an integrated contact over the integrated circuit device including:
      providing a via over the integrated circuit device;

forming a selective metal in the via such that said selective metal is electrically connected to said integrated circuit device;

growing at least one nanotube in the via, over the selective metal; and forming a cap over the nanotubes.

2. The method as claimed in claim 1 wherein providing the via includes providing the via having a high aspect ratio.

3. The method as claimed in claim 1 wherein providing the integrated circuit device includes forming a silicide layer over portions of the integrated circuit device.

4. The method as claimed in claim 1 wherein providing the integrated circuit device includes providing a transistor.

5. The method as claimed in claim 1 further comprising forming an electronic system including the integrated contact.

6. A method for forming an integrated circuit system comprising:

providing an integrated circuit device having a contact surface; and forming an integrated contact over the contact surface including:

forming a via over the contact surface;

forming a selective metal in the via over the contact surface such that said selective metal is electrically connected to said contact surface;

growing at least one nanotube in the via, over the selective metal over the contact surface; and forming a cap over the nanotubes partially in the via.

7. The method as claimed in claim 6 wherein forming the selective metal includes depositing cobalt, nickel, or iron.

8. The method as claimed in claim 6 wherein forming the contact surface includes forming a silicide with cobalt silicide or nickel silicide over a source region or a drain region.

9. The method as claimed in claim 6 wherein forming the contact surface includes forming a silicide layer with cobalt silicide or nickel silicide over a gate.

10. The method as claimed in claim 6 wherein forming the contact surface includes forming a first conductive layer having the contact surface.

11. A method for forming an integrated contact over an integrated circuit device, said method comprising:

forming a via over the integrated circuit device;

forming a selective metal in the via such that said selective metal is electrically connected to said integrated circuit device;

growing at least one nanotube in the via, over the selective metal;

forming a cap over the at least one nanotube.

12. The method of claim 11 wherein the via has a high aspect ratio.

13. The method of claim 11 further comprising forming a silicide layer over portions of the integrated circuit device.

14. The method of claim 11 wherein the integrated circuit device comprises at least one transistor.

15. The method of claim 11 wherein the selective metal is selected from the group consisting of cobalt, nickel, and iron.

16. The method of claim 11 wherein the integrated contact includes cobalt silicide formed over a source region or a drain region.

17. The method of claim 11 wherein the integrated contact includes nickel silicide formed over a source region or a drain region.

18. The method of claim 11 wherein the integrated contact includes cobalt silicide formed over a gate.

19. The method of claim 11 wherein the integrated contact includes nickel silicide formed over a gate.

* * * * *